(12) United States Patent
Tchamov et al.

(10) Patent No.: US 6,198,358 B1
(45) Date of Patent: Mar. 6, 2001

(54) VOLTAGE OR CURRENT CONTROLLED MULTIVIBRATOR OSCILLATOR CIRCUIT

(76) Inventors: Nikolay Tchamov, Lindforsinkatu 21 A 17, FIN-33720 Tampere (FI); Petri Jarske, Pirilänkuja 8, FIN-34240 Kämmenniemi (FI)

( * ) Notice: Subject to any disclaimer, the term of this patent is extended or adjusted under 35 U.S.C. 154(b) by 0 days.

(21) Appl. No.: 08/981,884

(22) PCT Filed: May 7, 1997

(86) PCT No.: PCT/FI97/00274

§ 371 Date: May 18, 1998

§ 102(e) Date: May 18, 1998

(87) PCT Pub. No.: WO97/43828

PCT Pub. Date: Nov. 20, 1997

(30) Foreign Application Priority Data

May 9, 1996 (FI) .......................................... 961986

(51) Int. Cl.[7] .................................................. H03K 3/281
(52) U.S. Cl. ........................ 331/113 R; 331/144; 331/177
(58) Field of Search .............................. 331/113 R, 144, 331/177 R; 327/227, 229, 190

(56) References Cited

U.S. PATENT DOCUMENTS

| | | | |
|---|---|---|---|
| 4,692,718 | * 9/1987 | Roza et al. ................. | 331/113 R |
| 4,884,042 | 11/1989 | Menon et al. ............... | 331/113 R |
| 5,367,270 | * 11/1994 | Lorenz ....................... | 331/113 R |
| 5,896,070 | * 4/1999 | Tchamov et al. ............ | 331/113 R |

FOREIGN PATENT DOCUMENTS 1354948  11/1970  (GB).

* cited by examiner

*Primary Examiner*—Arnold Kinkead
(74) *Attorney, Agent, or Firm*—Scully, Scott, Murphy & Presser

(57) ABSTRACT

An oscillator circuit comprises two main transistors (Q1, Q2), between which is provided a positive feedback by connecting each transistor base to the collector of the other transistor via buffer transistors (Q3, Q4). A capacitor (C) is connected between the emitters of the main transistors. The frequency of the oscillator is controlled by two current sources (I1, I2), which control the current (I2, I2) flowing through the capacitor (C). Additionally, a compensation current (Icom) is conducted via collector resistors (Rc1, Rc2) of the main transistors such that the current flowing through each resistor is essentially constant and independent of the control current (I1, I2), so the signal amplitude of the oscillator does not change during frequency control.

6 Claims, 2 Drawing Sheets

PARAMETERS:
Cval    1pF
Ival    0.9 mA

VOLTAGE OR CURRENT CONTROLLED MULTIVIBRATOR OSCILLATOR CIRCUIT

FIELD OF THE INVENTION

The invention relates generally to oscillator circuits, i.e. oscillators, and specifically to controllable oscillators based on multivibrators.

BACKGROUND OF THE INVENTION

Current- and voltage-controlled oscillators (ICO and VCO) are important components in the structures of transmitters and receivers. When applications to portable wireless communications systems are concerned, the main requirements for VCO/ICOs are: an operational frequency range of 1 to 20 GHz, a very low phase noise and the lowest possible operating voltage and power consumption. Depending on the structure, a communications device may comprise several VCO/ICOs needed for different purposes, e.g. frequency conversion, synthetization, modulation, etc. Their performance affects strongly the performance of the entire communications unit. On the other hand, the demand to implement these oscillators for silicon technologies faces several problems.

During the last few years several research projects have focused on finding optimal solutions. Two types of oscillators are mainly used as the cores of VCO/ICOs: sinusoidal oscillators and relaxation oscillators. Sinusoidal oscillators usually produce the best parameters as far as high frequency and low phase noise are concerned, but they can be easily implemented mostly on GaAS technologies only. A transition to bipolar, CMOS or BiCMOS technologies causes several problems mainly due to the highly conductive substrate. On the other hand, the speed of such available technologies is a challenge to researchers, as at present transient frequencies of 10 to 40 GHz are reached, which was previously considered to be a transient range possible to be covered only by materials based on GaAS. The speed of silicon-based technologies is sufficient enough for mobile communication in the frequency range of 1 to 20 GHz, used by most mobile stations and wireless LANs. An additional driving factor in the design of portable equipments has always been a high demand for as low an operating voltage as possible and a very low power consumption.

In oscillators of LC type, the active circuit components are kept out of the non-linear operation range, whereas in relaxation oscillators, the sinusoidal signal is the result of the incapability of the pulse circuit to switch fast enough at very high frequencies.

Oscillator circuits, i.e. oscillators, can be implemented by many different circuit structures. One of them is an astable (free-running) multivibrator. FIG. 1 shows a conventional emitter-coupled multivibrator circuit, which has been used for implementing voltage-controlled oscillators (VCO). The circuit comprises two transistors Q1 and Q2, between which is provided a positive feedback by connecting each transistor collector via a buffer transistor Q3, Q4 to control the base of the other transistor. The collectors of Q1 and Q2 are connected via resistors Rc1 and Rc2, respectively, to one potential of an operating voltage source 1 and the emitters are connected via current sources 3 and 4, respectively, to the lower potential of the operating voltage source. Correspondingly, the emitters of the buffer transistors Q3 and Q4 are connected via current sources 5 and 6 to the lower potential. Additionally, a reference capacitor C is connected between the emitters of Q1 and Q2. The positive feedback and series resonance circuits Rc1-C and Rc2-C constituted by the resistors RC1 and RC2 and the capacitance C lead to that the output of the multivibrator oscillates continuously between-two states, after the oscillation once has been trigged. The oscillation frequency is determined by the component values of the RC series resonance circuits. The oscillation frequency can be controlled by changing some of these component values, typically the capacitance C.

In the following, the operation of the multivibrator will be examined closer. To begin with, it is assumed that Q1 and Q3 are off (non-conduction state). When Q1 is off, the collector of Q1 and the base of Q2 are generally at the operating voltage potential. Then Q2 is on (conducting state), and its emitter current is I1+I2. The buffer transistor Q4 is likewise on and feeds base current to Q2. When Q2 is conductive, the current I1 flows from the emitter of Q2 via the capacitance C to the emitter of Q1. Then the current I1 charges/discharges the charge of the capacitance C, whereby the emitter potential of Q1 falls at a predetermined speed until Q1 becomes conductive when the base emitter voltage of Q1 exceeds about 0.6 V. When Q1 becomes conductive, its collector voltage begins to fall, which leads to that the buffer transistor Q3 begins to close. On account of a positive feedback via Q4, the base voltage of Q2 falls as well and Q2 closes. Q2 closing makes the collector voltage of Q2 rise, which accelerates the opening of Q3. Q3 opening increases the base current of Q1 via a positive feedback. A higher base current discharges parasitic capacitances of the base circuit of Q1 faster and accelerates thus the opening of Q1. When Q2 is off and Q1 is on, the current I2 flows from the emitter of Q1 via the capacitance C to the emitter of Q2, where the emitter voltage begins to fall until it makes Q2 open again and Q1 close via Q3.

The speed of such a multivibrator circuit (maximum resonance frequency) depends primarily on the properties of the transistors Q1 and Q2. The buffer transistors Q3 and Q4 increase the speed of the multivibrator circuit, because they make a higher base current possible, which again discharges the parasitic capacitances of the base circuit of the transistors Q1 and Q2 faster and accelerates thus the switching of the transistor from one state to another.

The lowest possible operating voltage Vcc will be achieved when it is assumed that the current sources 3 and 4 are ideal, i.e. no voltage loss is provided in them. When the ideal current sources are replaced by some practical circuit structure, such as current mirrors, Vcc increases. Returning to the operating principle of the circuit, it can be stated that current paths are either Q1-C-current mirror4 or Q2-C-current mirror 3 and that the current mirrors produce a stable current through the reference capacitor C, which is the main reason for the typical low phase noise. In search of a new way of increasing the speed, the reference capacitor cannot be decreased much more, because it will be of the order of parasitic capacitances, which leads to the fact that a controlled planning of the circuit is not possible.

Nowadays there is, however, a need of ever-increasing speeds while an operating voltage as low as possible is desired, especially in electronic equipments using battery power supplies.

For an implementation of a voltage- or current-controlled oscillator by means of a multivibrator circuit, the circuit requires a suitable supplementary control. Such a control should be as simple as possible.

In the circuit of FIG. 1, the pulse amplitude is determined by the sum of the currents I1+I2 multiplied by the value of the collector resistor Rc1 or Rc2 of the corresponding cycle.

The pulse width is determined by the value of the current which is supplied by I1 or I2 via the reference capacitor C during its recharge cycles. Accordingly, either the capacitance of the reference capacitor C or the current flowing through it has to be changed for the frequency control.

The capacitance may be changed if a varactor is used as reference capacitor C. A problem is, however, that varactor technologies are not generally compatible with BiCMOS technologies, for instance. In the BICMOS technology, a PN junction can be used instead. But then the capacitor works in the circuit of FIG. 1 and changes continuously the polarity of the voltage. In this case, a serial connection of two varactors, opposite to each other, may be some sort of solution, but the operation of the forward voltage region of one diode shows certain non-linearities and the phase noise of the multivibrator could be so high that it is unacceptable.

Another alternative is to change the current and, in consequence of that, the recharge speed of the capacitor. This a very effective way of controlling the frequency of the oscillations, but the main drawback is its direct influence on the amplitude of the pulses.

SUMMARY OF THE INVENTION

An object of the present invention is a novel voltage- or current controlled oscillator circuit provided with a simple frequency control, a higher speed and a lower operating voltage and power consumption than the circuits according to the prior art.

The invention relates to an oscillator circuit, comprising an operating voltage source, a first non-linear amplifier component comprising a first and a second main electrode and a control electrode, a second non-linear amplifier component comprising a first and a second main electrode and a control electrode, a third amplifier component, the main electrodes of which are connected to the control electrode of the first amplifier component and to a first potential of the operating voltage source and the control electrode of which is functionally connected to the first main electrode of the second amplifier component in such a way that a positive feedback is provided, a fourth amplifier component, the main electrodes of which are connected to the control electrode of the second amplifier component and to the first potential of the operating voltage source and the control electrode of which is functionally connected to the first main electrode of the first amplifier component in such a way that a positive feedback isprovided, a capacitive component connected between the second main electrode of the first amplifier component and the second main electrode of the second amplifier component, a first and a second resistor, via which the first main electrode of the first amplifier component and the first main electrode of the second amplifier component, respectively, are connected to the first potential of the operating voltage source. The oscillator is characterized in that it comprises a first controllable current source connected in series between the second main electrode of the first amplifier component and a second potential of the operating voltage source, a second controllable current source connected in series between the second main electrode of the second amplifier component and the second potential of the operating voltage source, while the currents I1 and I2 of said first and second current source determine the frequency of the oscillator, means for conducting compensation current via the first resistor and the second resistor, respectively, in such a way that the current flowing through each resistor is essentially constant and independent of the currents I1 and I2.

The relaxation oscillator according to the invention is based on a multivibrator structure comprising a first and a second amplifier component, which are cross-connected via a third and a fourth buffer amplifier component to provide a positive feedback. Frequency is controlled by controlling the current flowing through a reference capacitor. In order to make the amplitude of an output signal of the oscillator independent of the control current, an extra compensation current is conducted via the resistors connected between the first and the second amplifier component and a first potential of an operating voltage source. The compensation current is controlled preferably in the same way as the control current, but in a direction different from that of the control current in such a way that the current via the resistors is constant. In other words, the compensation current compensates for the changes in the control currents. This compensation current is generated by a fifth and a sixth amplifier component connected from the first main electrode of the first and the second amplifier component, respectively, via a compensation current source to ground. The fifth and sixth amplifier component are connected to follow the states of the first and the second amplifier component, respectively, by forced control.

The third and the fourth buffer amplifier component may preferably have corresponding pull-down amplifier components, which are cross connected to follow the states of the second and the first amplifier component, respectively, by forced control. This increases significantly the speed and the effectiveness of emitter followers constituted by the third and the fourth amplifier component and provides a higher amplitude and a lower output resistance from the same low-voltage power supply in comparison with the prior art solutions.

BRIEF DESCRIPTION OF THE DRAWINGS

In the following, the invention is described with reference to the attached drawing, in which.

PREFERRED EMBODIMENTS OF THE INVENTION

The present invention is applicable to lowering operating voltage, increasing speed and implementing frequency control in oscillators based on so-called emitter-coupled multivibrator circuits. Although the oscillator in FIG. 2 uses bipolar transistors as amplifier means, the circuit solutions according to the invention may use any type of non-linear amplifier components, in principle, such as MOS, CMOS, SOI, HEMT and HBT transistors, microwave tubes and vacuum tubes. The names of the electrodes may vary in these components. The main electrodes of a bipolar transistor are a collector and an emitter and the control electrode constitutes a base. In FETs, the corresponding electrodes are a drain, a source and a gate. In vacuum tubes, these electrodes are usually called an anode, a cathode and a gate. Thus the term emitter-coupled multivibrator shall also be understood in this connection as a more general concept, covering e.g. the terms cathode-coupled or source-coupled multivibrator.

Figure 3:
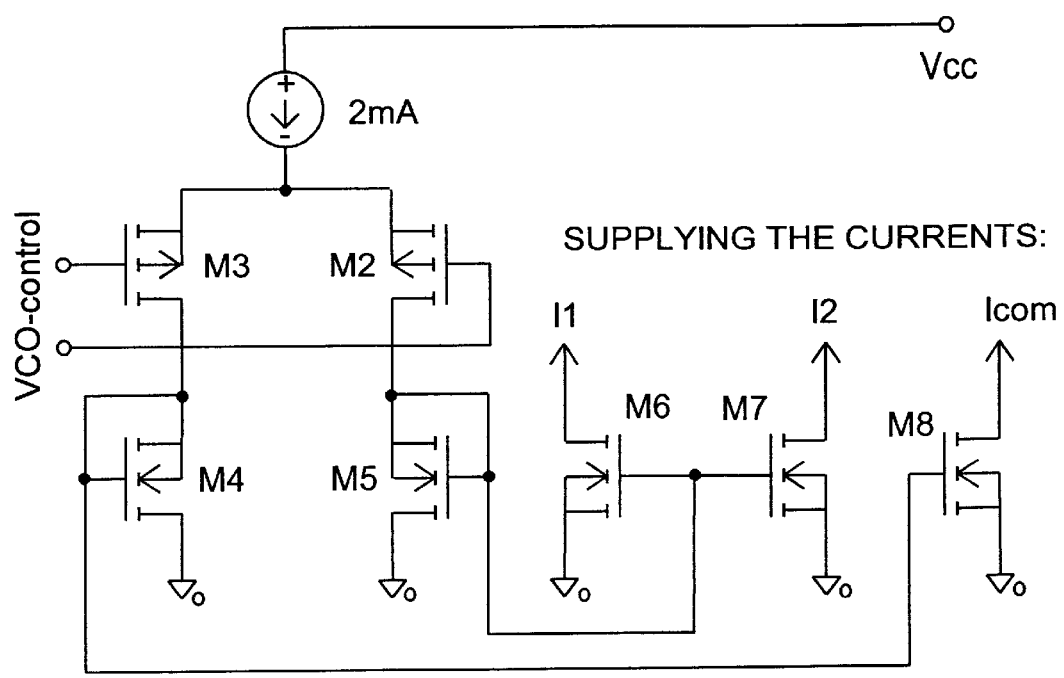
FIG. 3 is a circuit diagram of a controllable current source.

FIG. 3 shows an oscillator according to a preferred embodiment of the invention, based on an emitter-coupled multivibrator circuit.

The oscillator comprises six NPN bipolar transistors Q1, Q2, Q3, Q4, Q5, and Q6. The collector electrode of the transistor Q1 is connected via a resistor Rc1 to an operating voltage Vcc and the emitter via a current source I1 to an operating voltage potential 0V. The collector of the transistor Q2 is connected via a resistor Rc2 to the operating voltage Vcc and the emitter via a current source I2 to the operating voltage potential 0V. A capacitor C is connected between the emitters of the transistors Q1 and Q2. A positive feedback is provided between the transistors Q1 and Q2 by connecting the collector of Q2 via a buffer transistor Q3 to the base of Q1 and the collector of Q1 via a buffer transistor Q4 to the base of Q2.

To be more exact, the base of Q3 is connected to the collector of Q2 and the collector to the operating voltage Vcc. The emitter of Q3 is connected to the base of the transistor Q1.

Correspondingly, the base of Q4 is connected to the collector of Q1 and the collector to the operating voltage Vcc. The emitter of Q4 is connected to the base of the transistor Q1.

Thanks to the buffer transistors Q3 and Q4, the base currents of the transistors Q1 and Q2 can be made higher, which accelerates the discharge of parasitic capacitances of the base electrodes and so the switching speed of the transistors.

Additionally, a pull-down transistor M1, which is a MOS transistor, is connected in series between the emitter of Q3 and the operating voltage 0V. Correspondingly, a pull-down transistor M2, which is a MOS transistor, is connected in series between the emitter of Q4 and the operating voltage 0V. M1 and M2 are cross-connected to follow the states of the transistors Q2 and Q1, respectively, by mechanical control. To be more exact, the base of M1 is connected to the base of Q2 and the base of M2 is connected to the base of Q1. This increases the speed of the circuit and improves the shape of the output signal at symmetric outputs Vout1 and Vout2.

The positive feedbacks and the series resonance circuits Rc1-C and Rc2-C constituted by the resistors Rc1, Rc2 and the capacitor C provide that the multivibrator output Vout1–Vout2 oscillates between two states, when the oscillation once has been triggered. The resonance frequency of the circuit is set by the values of Rc1, Rc2 and C.

Figure 1:
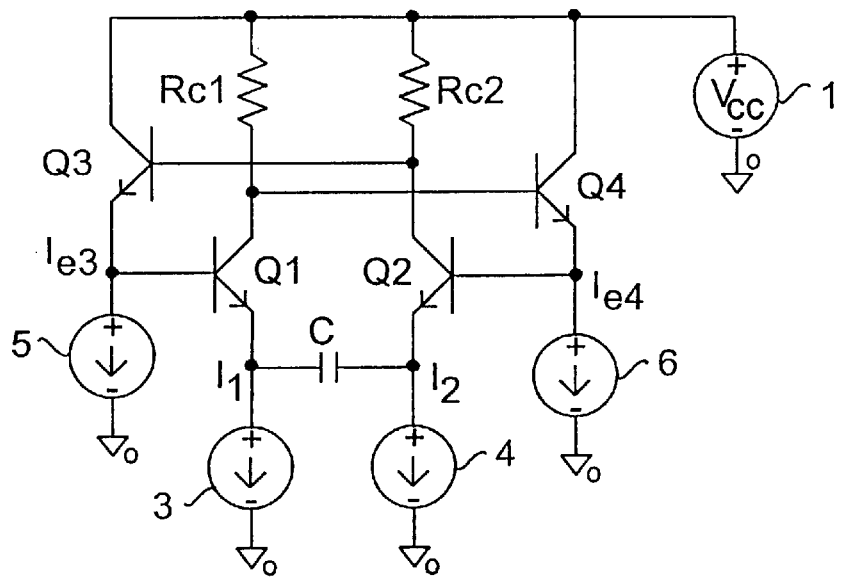
FIG. 1 is a circuit diagram of a multivibrator according to the prior art.

As was described earlier in connection with FIG. 1, the pulse amplitude is determined by the sum of the currents I1+I2 multiplied by the value of the collector resistor Rc1 or Rc2 of the corresponding cycle. The pulse width is determined by the value of the current supplied by I1 or I2 via the reference capacitor C during its recharge cycles. So the frequency can be controlled by controlling the current flowing through the reference capacitor C. In the preferred embodiment of the invention shown in FIG. 2, the frequency is controlled by controlling the currents I1 and I2 of the controllable current sources.

This is an efficient way of controlling the frequency, but the main drawback is its direct influence on the pulse amplitude. In order to make the amplitude of the output signal of the oscillator independent of the control current, an extra compensation current Icom is conducted according to the invention via Rc1 and Rc2. The compensation current Icom is controlled preferably in the same way as the control currents I1 and I2, but in a direction different from that of the control currents in such a way that the current via the resistors Rc1 and Rc2 is constant, while the current via the capacitor C changes. In other words, the compensation current Icom compensates for changes in the control currents I1 and I2.

Figure 2:
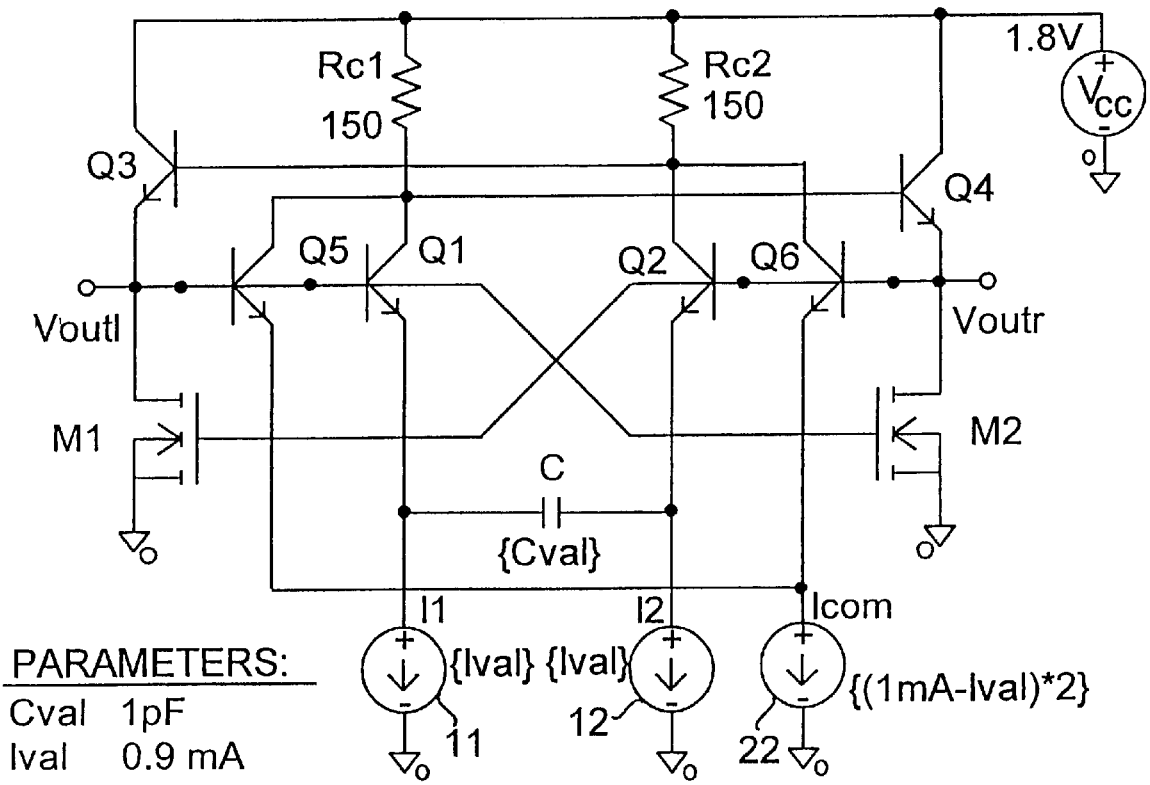
FIG. 2 is a circuit diagram of an oscillator according to the invention.

In the embodiment of FIG. 2, this compensation current Icom is generated by the transistors Q5 and Q6, which are connected from the collector of Q1 and Q2 via a compensation current source 22 to ground. Q5 and Q6 are connected to follow the states of Q1 and Q2, respectively, by mechanical control.

The value of the currents I1 and I2 can be different, if a difference is required between the pulse width and a pause. Generally, I1=I2 is selected in such way that the current is within the area of the maximum transient speed of an avalanche process. This can be for instance a current by which the transient frequency $f_T$ of the transistors to be used is achieved.

To be more exact, the collector of the transistor Q5 is connected to the collector of Q1 and the base to the base of Q1. The collector of the transistor Q6 is connected to the collector of Q2 and the base to the base of Q2. The emitters of the transistors Q5 and Q6 are interconnected and connected via a current source 22 to the operating voltage potential 0V.

In an ideal current source 11, 12 or 22, no voltage losses are provided. The real current source 11, 12 or 22 is, however, constituted e.g. by a current mirror, which is controlled by a voltage. A voltage loss is then provided across the current mirror, whereby a somewhat higher operating voltage is needed.

Thus the circuit of FIG. 2 needs for operation an operating voltage of at least 2.2 V (=1.8V+0.4V), where the voltage across the current sources 11, 12 and 22 is assumed to be about 0.4 V, when MOS transistors are used for the generation of the currents I1 and I2.

If the current source 11, 12 or 22 is constituted by a current mirror controlled by a voltage, a voltage-controlled oscillator VCO is provided. FIG. 3 shows one way of implementing VCO from the circuit of FIG. 2, consisting in that the currents I1, I2 and Icom are supplied by current mirrors M6–M7 and M8, which are controlled by a differential amplifier M2–M3–M4–M5. The differential amplifier is controlled by a control voltage VCOcontrol. If the current source 11, 12 or 22 is implemented by a circuit solution controlled by a current, a current-controlled oscillator is provided. These different implementations of a current source are obvious to one skilled in the art.

The circuit of FIG. 2 has been analyzed by using 0.8 $\mu$m BiCMOS technology, in which bipolar NPN transistors have the transient frequency $F_T$ =14 GHz. The current flowing through the transistors is selected in such a way that it provides this transient frequency $F_{TMAX}$, the current being about 800 $\mu$A on this technology. The MOS transistors M1 and M2 have W=1.2 $\mu$m and W/L=100. The maximum oscillation frequency of about 1.1 GHz is achieved by the minimum value 0.5 pF of the capacitor C. The amplitude is about 0.4V and the power consumption only 5.6 mW from the 2.2V operating voltage. The controllability of the circuit is 750 MHz/mA. The shape of the signal across the reference capacitor C remains as is typical of emitter-coupled multivibrators, which is the main reason for very low phase noise. The oscillator is capable of operating also at low frequencies, at which big external capacitors C can be used more easily.

The invention can also be implemented exclusively by bipolar technique.

The oscillator circuit according to the invention is particularly suitable for modern Phase-Locked Loops (PLL) in communications and microprocessor applications.

The drawings and the related description are only intended to illustrate the invention. The details of the invention may vary within the scope and spirit of the attached claims.

What is claimed is:

1. An oscillator circuit comprising:

an operating voltage source, a first non-linear amplifier component comprising a first and a second main electrode and a control electrode, a second non-linear amplifier component comprising a first and a second main electrode and a control electrode, a third amplifier component having first and second main electrodes which are connected to the control electrode of the first non-linear amplifier component and to a first potential of the operating voltage source and the control electrode of which is operationally connected to the first main electrode of the second non-linear amplifier component in such a way that a positive feedback is provided, a fourth amplifier component having first and second main electrodes which are connected to the control electrode of the second non-linear amplifier component and to the first potential of the operating voltage source and the control electrode of which is operationally connected to the first main electrode of the first non-linear amplifier component in such a way that a positive feedback is provided, a capacitive component connected between the second main electrode of the first non-linear amplifier component and the second main electrode of the second non-linear amplifier component, a first and a second resistor, via which the first main electrode of the first non-linear amplifier component and the first main electrode of the second non-linear amplifier component, respectively, are connected to the first potential of the operating voltage source, a first controllable current source connected in series between the second main electrode of the first non-linear amplifier component and a second potential of the operating voltage source, a second controllable current source connected in series between the second main electrode of the second non-linear amplifier component and the second potential of the operating voltage source, while currents I1 and I2 of said first and second current sources determine the frequency of the oscillator circuit, means for conducting compensation current via the first resistor and the second resistor, respectively, in such a way that the current flowing trough each resistor is essentially constant and independent of the currents I1 and I2, a first amplifier connected between the second main electrode of the third amplifier component and the second potential of the voltage source with its control electrode connected to the control electrode of the second non-linear amplifier component, a second amplifier connected between the second main electrode of the fourth amplifier component and the second potential of the voltage source with its control electrode connected to the control electrode of the first non-linear amplifier component.

2. An oscillator circuit comprising:

an operating voltage source, a first non-linear amplifier component comprising a first and a second main electrode and a control electrode, a second non-linear amplifier component comprising a first and a second main electrode and a control electrode, a third amplifier component having first and second main electrodes which are connected to the control electrode of the first non-linear amplifier component and to a first potential of the operating voltage source and the control electrode of which is operationally connected to the first main electrode of the second non-linear amplifier component in such a way that a positive feedback is provided, a fourth amplifier component having first and second main electrodes which are connected to the control electrode of the second non-linear amplifier component and to the first potential of the operating voltage source and the control electrode of which is operationally connected to the first main electrode of the first non-linear amplifier component in such a way that a positive feedback is provided, a capacitive component connected between the second main electrode of the first non-linear amplifier component and the second main electrode of the second non-linear amplifier component, a first and second resistor, via which the first main electrode of the first non-linear amplifier component and the first main electrode of the second non-linear amplifier component, respectively, are connected to the first potential of the operating voltage source, a first controllable source connected in series between the second main electrode of the first non-linear amplifier component and a second potential of the operating voltage source, a second controllable current source connected in series between the second main electrode of the second non-linear amplifier component and the second potential of the operating voltage source, while currents I1 and I2 of said first and second current sources determine the frequency of the oscillator circuit, means for conducting compensation current via the first resistor and the second resistor, respectively, in such a way that the current flowing through each resistor is essentially constant and independent of the currents I1 and I2, a fifth amplifier component, the first main electrode of which is connected to the first main electrode of the first non-linear amplifier component and the control electrode of which is operationally connected to the second main electrode of the third amplifier component, a sixth amplifier component, the first main electrode of which is connected to the first main electrode of the second non-linear amplifier component and the control electrode of which is operationally connected to the second main electrode of the fourth amplifier component, a third controllable current source, a first terminal of which is connected to the second main electrodes of the fifth and the sixth amplifier components and a second terminal of which is connected to the second potential of the voltage source, a seventh amplifier connected between the second main electrode of the third amplifier component and the second potential of the voltage source with its control electrode connected to the control electrode of the second non-linear amplifier component, an eighth amplifier connected between the second main electrode of the fourth amplifier component and the second potential of the voltage source with its control electrode connected to the control electrode of the first non-linear amplifier component.

3. The oscillator according to claim 2, wherein the third current source is controlled in such a way that the sum of the compensation current and the currents I1 and I2 is essentially constant.

4. The oscillator according to claim 1 or 3, wherein the first and second non-linear amplifier components and the third and fourth amplifier components are bipolar transistors and the first and second amplifiers are MOS transistors.

5. The oscillator according to any one of the claims 1 to 3, wherein all amplifier components are bipolar transistors.

6. The oscillator according to claim 2, wherein the first non-linear, second non-linear, third, fourth, fifth and sixth amplifier components are bipolar transistors and the seventh and eighth amplifiers are MOS transistors.

* * * * *